United States Patent [19]

Futsuhara

[11] Patent Number: 4,667,184

[45] Date of Patent: May 19, 1987

[54] APPARATUS FOR COUNTING ENUMERATION INPUT PULSES

[75] Inventor: Koichi Futsuhara, Omiya, Japan

[73] Assignee: The Nippon Signal Co., Ltd., Japan

[21] Appl. No.: 712,902

[22] Filed: Mar. 18, 1985

[30] Foreign Application Priority Data

Mar. 17, 1984 [JP] Japan .................................. 59-51544
Mar. 23, 1984 [JP] Japan .................................. 59-55782

[51] Int. Cl.$^4$ ...................... B61L 29/22; G08B 21/00
[52] U.S. Cl. ...................................... 340/507; 340/47;
340/653; 377/30; 307/442
[58] Field of Search ................... 377/115, 116, 28, 30, 377/125, 77, 80, 81; 328/129.1, 130.1; 307/442; 340/47, 507, 653

[56] References Cited

U.S. PATENT DOCUMENTS

| | | | |
|---|---|---|---|
| 2,858,429 | 10/1958 | Heywood | 377/116 |
| 2,956,181 | 10/1960 | Norman | 377/116 |
| 3,185,864 | 5/1965 | Amodei et al. | 377/81 |
| 4,314,237 | 2/1982 | Darrow | 340/507 |

OTHER PUBLICATIONS

Futsuhara, Koichi and Inose, Katsuichi, "A Rearization of High Reliable Sensor," Dept. of Tech. Dev. and Dept. of Signal Eng., Nippon Signal Co., Ltd., Urawashi, Saitama 338.

Shome, T. K., "Timing Relays," Indian Railway Tech. Bull., pp. 1-6 (1979).

Primary Examiner—John S. Heyman
Attorney, Agent, or Firm—Lowe, Price, LeBlanc, Becker & Shur

[57] ABSTRACT

In an apparatus for counting enumeration input pulses according to the present invention, an enumeration input pulse is put in parallel in a plurality of stages of logical product computing oscillator means, and counting in the logical product computing oscillator means of the subsequent stage is advanced on condition that an output of termination of counting is put out from the logical product computing oscillator means of the precedent stage. For this purpose, delay means is arranged after the logical product computing oscillator means to set the time from the point of output of the logical product computing oscillator means of the precedent stage to the point of termination of a predetermined delay time so that this time is longer than the width of the enumeration input pulse and shorter than the frequency thereof. Furthermore, the logical product computing oscillator means makes an error at a time of a circuit failure in such a manner that no output is generated, and the delay time and enumeration input pulse make an error at a time of a circuit failure in such a way that a fail-safe effect is attained. Accordingly, enumeration input pulses can be counted with a fail-safe effect.

21 Claims, 10 Drawing Figures

APPARATUS FOR COUNTING ENUMERATION INPUT PULSES

BACKGROUND OF THE INVENTION

The present invention relates to a fail-safe apparatus for counting enumeration input pulses. More particularly, the present invention relates to a fail-safe counting apparatus in which counting is completed after a predetermined time from the point of receipt of a counting instruction. The counting apparatus of the present invention can be utilized as a fail-safe timer for stopping or starting buzzer sounding after the lapse of a predetermined time, for example, in a crossing alarm signal apparatus.

For example, in the crossing alarm signal apparatus, a bell or buzzer is sounded while a train is passing through a railway crossing. Starting of buzzer sounding should not be delayed by any errors and stopping of buzzer sounding should not be quickened by any errors. In order to satisfy this requirement, a fail-safe counting apparatus for counting a predetermined time after receipt of a counting instruction becomes necessary.

A counting apparatus of this type has already been proposed by us in Japanese Patent Application Laid-Open Specification No. 41702/82. In this proposal, there is used a memory device indicating an asymmetrical error mode, in which an output voltage is reduced to zero when a failure takes place in a circuit. In this memory device, enumeration input signals having positive and negative polarities and reset signals in which the voltage is set at OV whenever they are reset by a polar voltage are used as the input signals. The memory device comprises steering gate circuits consisting of an asymmetrical error logic circuit producing an output voltage on receipt of the enumeration input signal, and output of the respective steering gate circuits are put as set signals in respective memory circuits.

In this prior technique, since there are disposed steering circuits and ternary inputs are necessary, the circuit structure is complicated.

SUMMARY OF THE INVENTION

It is a primary object of the present invention to provide a fail-safe counting apparatus in which asymmetrical error characteristics are attained with respect to the output voltage and to counting time without using steering circuits and ternary inputs.

In principle, according to the present invention, multiple stages of logical product computing oscillator means are utilized and the number of pulses is counted up by actuating or de-energizing the logical product computing oscillator means in succession in response to enumeration input pulses after receipt of a counting instruction. This operation is made possible by the following method. Simultaneously with or slightly after generation of the counting instruction, the logical product computing oscillator means of the first stage is actuated or deenergized (logical reversion) by the first appearing enumeration input pulse, whereby the first pulse is counted. The logical product computing oscillator means of subsequent stages count up second and subsequent pulses if signals of logical reversion, that is, signals of termination of counting, are received from the logical product computing oscillator means of the preceding stages. If the output of logical reversion of the logical product computing oscillator means of the preceding stage is put in the logical product computing oscillator means of the subsequent stage immediately (without delay) or while the enumeration input pulse to be counted is still present in the preceding stage, the enumeration input pulse is simultaneously counted in the respective stages, and the sequential count-up operation becomes impossible. Accordingly, the output of logical reversion of the logical product computing oscillator means of the preceding stage is delayed and then put in the logical product computing oscillator means of the subsequent stage. This delay time is set so that the output of the logical reversion of the preceding stage is put in the logical product computing oscillator means between the pulse counted in the preceding stage and the pulse to be counted in the subsequent stage. Namely, the above-mentioned delay time is longer than the width of the enumeration input pulse and shorter than the period of the enumeration input pulses.

The delay means for setting the above-mentioned delay time comprises first and second delay means. The output of the first delay means is fed back to its logical product computing oscillator means by feedback means, and before or after starting of counting, the once-produced oscillation state is self-retained.

If the enumeration input pulse and the output signal of the second delay means of the preceding stage are put into the logical product computing oscillator means with the same logical values, the output logic (oscillation or stopping of oscillation) of the logical product computing oscillator means is reversed to the same logic as the logical values of input signals and is then put out. For example, if each of the input signals is a logical value of "1", the output is oscillated, and if each of the input signals is a logical value of "0", oscillation of the output is stopped.

For example, in case of the crossing alarm signal apparatus, in the case where buzzer sounding is stopped after a predetermined time from the point of receipt of the counting instruction, a logical value of "1" as a signal of termination of counting is put out from the second delay means of the preceding stage, and if an "and" condition is established between this logical value and a logical value "1" of the enumeration pulse input signal (the pulse of a logical value of "1" is counted), the logical product computing oscillator means of the subsequent stage is oscillated, and counting is advanced. In the case where buzzer sounding is started after a predetermined time from the point of receipt of the counting instruction, a logical value of "0" as a signal of termination of counting is put out from the second delay means of the preceding stage, when the enumeration pulse input signal (the pulse of a logical value of "0" is counted) becomes a logical value of "0", oscillation of the logical product computing oscillating means of the subsequent stage, which has been continued, is stopped, and counting is advanced.

Various conditions must be satisfied for using a counting apparatus having the above-mentioned structure as a fail-safe system for stopping or starting buzzer sounding, for example, in the crossing alarm signal apparatus.

In the first place, it is required that the output of the logical product computing oscillator means should make an error in such a way that no output is generated by a circuit fault. In this case, a signal of a logical value of "0" is put in the logical produce computing oscillating means of the subsequent stage, and if the object of counting by the enumeration input pulse is the pulse of a logical value of "1", the logic values are different and an error is made in such a way that counting is not advanced. On the contrary, if the object of counting is the pulse of a logical value of "0", the logical values are identical and an error is made in such a way that counting is advanced. Accordingly, the former case is suitable for fail safety of stopping of buzzer sounding, and the latter case is suitable for fail safety of starting of buzzer sounding.

Secondly, it is required that in the first delay means, an error should be made in such a way that the delay time should not be shortened. This is to prevent erroneous self retention caused by noise.

Thirdly, it is required that within the delay time of the second delay means or the width of the enumeration input pulse, an asymmetrical error should be made in such a way as to attain a fail-safe effect of prolonging or shortening the delay time or the pulse width. More specifically, in the case counting of both input signals of the logical product computing oscillator means of the subsequent stage are "1", then counting is advanced; if the delay means of the preceding stage makes an error in such a way that the delay time is not shortened at a time of a fault and the enumeration input pulse signal makes an error in such a way that the pulse width of the logical value of "1" is not prolonged, counting is not advanced and a fail-safe effect is attained. Furthermore, in the case where counting of both input signals are "0" and then counting is advanced, the second delay means of the preceding stage makes an error in such a way that the delay time is not prolonged at a time of a fault and the enumeration input pulse signal makes an error in such a way that the pulse width of the logical value of "0" is not shortened, counting is advanced, and for example, starting of buzzer sounding is advanced and a fail-safe effect is attained.

As is apparent from the foregoing description, the present invention is to provide a fail-safe counting apparatus in which an output voltage is generated after a predetermined time from the point of receipt of a counting instruction and when a fault occurs in a circuit, an error is made in such a way that an output voltage is not produced or the counting time is prolonged.

Furthermore, the present invention is to provide a fail-safe counting apparatus in which an output voltage is extinguished after a predetermined time from the point of receipt of a counting instruction and when a fault occurs in a circuit, an error is made in such a way that an output voltage is not generated or the counting time is not shortened.

The counting apparatus having the above-mentioned structural features and functions comprises counting instruction generating means and a plurality of stages of unit counting means, each unit counting means including enumeration input pulse generating means, logical product computing oscillator means receiving an enumeration input pulse from the pulse generating means and making an error in such a way that an output is generated when a fault occurs in a circuit, rectifying means for rectifying an output of the logical product computing oscillator means, first delay means arranged subsequently to the rectifying means which makes an error at a time of a fault in such a way that a delay time T1 is not shortened, self-retention means for feeding back an output of the first delay means as an input to the logical product computing oscillator means to effect self-retention of oscillation thereof, and second delay means for putting out the output of the first delay means with a delay time T2, the period from the point of output of the rectifying means to the point of termination of the delay time T2 being longer than the width T3 of the enumeration input pulse but shorter than the period T4 of the enumeration input pulse, wherein in the delay time T2 and the width of the enumeration input pulse, an asymmetrical error is made in such a way that the delay time and pulse width are prolonged or shortened to attain a fail-safe effect, a counting instruction from the counting instruction generating means is put in the logical product computing oscillator means of the unit counting means of the first stage and the output of the second delay means of the unit counting means of the precedent stage is put in the logical product computing oscillator means of the unit counting means of the subsequent stage, and wherein the output of the logical product computing oscillator means of the unit counting means of the first stage is reversed to the same logic (oscillation or stopping of oscillation) as that of the first enumeration input pulse and on the condition that the enumeration input pulse and the output signal of the second delay means of the unit counting means of the precedent stage are put in with the same logical value, the output of the logical product computing oscillator means of the unit counting means of the subsequent stage is reversed to the same logic as the input signals, and the output of the rectifying means is used as an enumeration value.

The characteristic structures and functions of the present invention will now be described in detail with reference to embodiments. However, the scope of the present invention is by no means limited by these embodiments.

DETAILED DESCRIPTION OF THE PREFERRED EMBODIMENTS

First Embodiment

The present embodiment relates to a fail-safe counting apparatus to be used, for example, as timer means for stopping buzzer sounding after a predetermined time from the point receipt of a counting instruction in a crossing alarm signal apparatus, in which a fail-safe effect is ensured by an asymmetrical error which is made in such a way that stopping of buzzer sounding is not quickened, that is, counting is not advanced.

Figure 1:
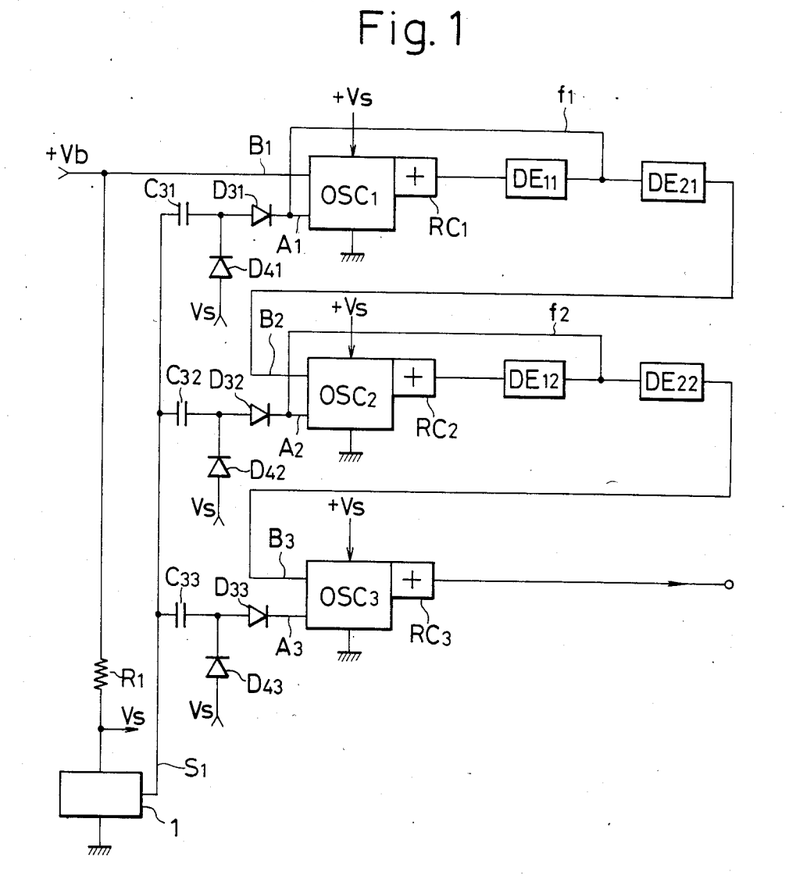
FIG. 1 is a basic circuit diagram of the counting apparatus of the present invention.
Figure 2:
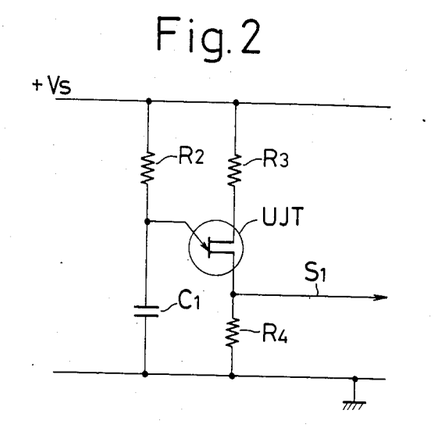
FIG. 2 is a circuit diagram of a pulse generator that can be used in the present invention.

Referring to FIG. 1, a pulse generator 1 is actuated by a power source voltage Vb applied through a resistor R1. This pulse generator 1 is constructed so that when a fault occurs therein, the pulse generator 1 makes an error in such a way that the pulse width is not prolonged. A specific example of the pulse generator 1 is shown in FIG. 2, and an extended oscillating circuit using a unijunction transistor UJT (double base diode) is shown. A programmable unijunction transistor (PUT) can also be used. R2 through R4 represent resistors and C1 represents a capacitor. When a circuit fault takes place, oscillation is stopped in the pulse generator shown in FIG. 2, and therefore, the pulse width is not prolonged at a time of a fault in the pulse generator 1. In the circuit structure shown in FIG. 2, the terminal voltage of the resistance R4 is utilized as a pulse output S1. An amplifier may be arranged in the subsequent stage.

OSC1 through OSC3 represent logical product computing oscillators, and rectifying circuits RC1 through RC3 are connected to the outputs of the logical product computing oscillators OSC1 through OSC3, respectively. The circuit is constructetd so that at the time of a fault, none of these elements produce outputs. These logical product computing oscillators OCSC1 through OSC3 and rectifying circuits RC1 through RC3 are disclosed, for example, in Japanese Utility Model Application Laid-Open Specification No. 4764/82 and Japanese Patent Publication No. 38211/76.

Figure 3:
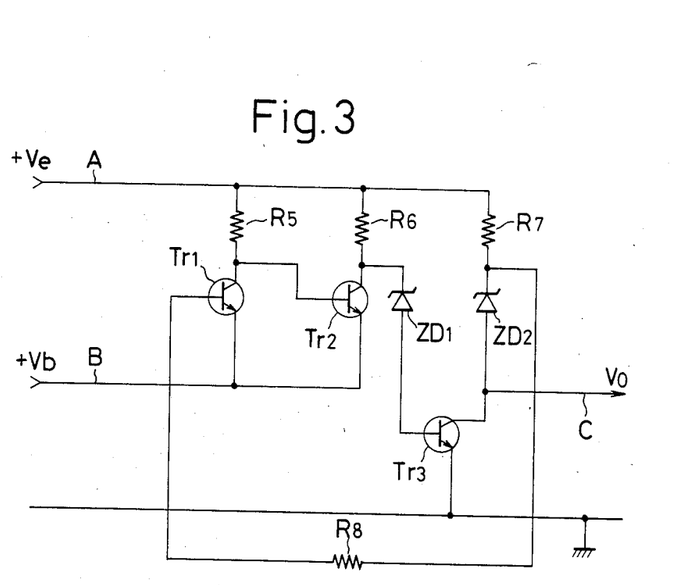
FIG. 3 is a circuit diagram of a logical product computing oscillator that can be used in the present invention.

An example of such known logical product computing oscillators is shown in FIG. 3. A transistor Tr1 is directly connected to a transistor Tr2, and a collector of the transistor Tr2 is connected to a base of a transistor T3 through a zener diode ZD1. A connection point between a zener diode ZD2 connected to a collector of the transistor Tr3 and a resistor R7 is connected to a base of the transistor Tr1 through a resistor R8, R5 and R6 each represent a collector resistor. A stands for an input terminal, B stands for a power source input terminal, and C stands for an output terminal.

In the logical product computing oscillator shown in FIG. 3, in the case where a voltage Ve higher than the zener voltages VZ1 and VZ2 of the zener diodes ZD1 and ZD2 and the power source voltage Vb (Ve>VZ1>Vb>VZ2) is applied to the input terminal A, that is, in the case where the voltage of the input terminal A exceeds the limit of the power source voltage, the transistors Tr1 through Tr3 repeat in succession on-off operations, and an oscillating output which oscillates between the input voltage level given to the input terminal A and a level equal substantially to zero is obtained at the output terminal C. When the input voltage applied to the input terminal A is not sufficient to actuate the transistors Tr1 through Tr3 or a fault such as breaking takes place in the circuit, the oscillation is stopped, and therefore, no oscillating output appears at the output terminal C.

Figure 4:
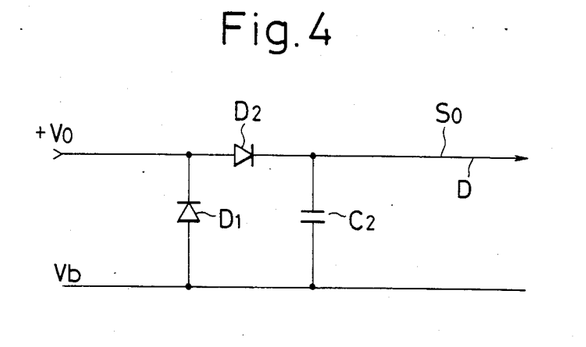
FIG. 4 is a circuit diagram of a rectifying circuit that can be used in the present invention.

A specific example of the rectifying circuits RC1 through RC3 is shown in FIG. 4, and the circuit is constructed so that an alternating current voltage Vo given from the logical product computing oscillator OSC1, OSC2 or OSC3 is clamped at the power source voltage Vb by the diode D1 through a coupling capacitor (not shown) and rectified and smoothed by diodes D1 and D2 and a capacitor C2, and a rectified output S0 is obtained at an output terminal D. When a failure such as breaking occurs in the circuit shown in FIG. 4, no rectified output is obtained in this rectifying circuit.

The rectifying circuit shown in FIG. 4 is a so-called voltage doubler half-wave rectifying circuit (a coupling capacitor is not shown). The reason why the voltage Vo is clamped to the power source voltage Vb by the diode D1 is that a voltage exceeding the limit of the power source voltage is put in the computing oscillator of the subsequent stage so that it is oscillated by the output of this rectifying circuit.

Incidentally, when the operation is performed by a negative power source, the directions of the diodes are reversed.

Referring to FIG. 1 again, enumeration pulses S1 from the pulse generator 1 are put in parallel into the input terminals A1, A2 and A3 of the logical product computing oscillators OSC1, OSC2 and OSC3. The enumeration input circuits of the logic product computing oscillators OSC1, OSC2 and OSC3 have a structure in which capacitors C31 through C33 are connected in series to diodes D31 through D33, respectively and clamping diodes D41 through D43 are connected to the connecting points between the capacitors C31 through C33 and diodes D31 through D33, respectively. These circuits are clamped at a direct current power source voltage Vs and the voltages at the input terminals A1, A2 and A3 are maintained at a level exceeding the limit of the power source voltage, which is higher than the voltages of the input terminals B1, B2 and B3, and an oscillating operation is effected in each of the logical product computing oscillators OSC1, OSC2 and OSC3.

First delay circuits DE11 and DE12 are connected to the rectifying circuits RC1 and RC2, respectively. Outputs of the delay circuits DE11 and DE12 are fed back to the input terminals A1 and A2 of the logical product computing oscillators OSC1 and OSC2, respectively, through feedback circuits F1 and F2 acting as self-retention circuits, and in the case where the pulse width T3 of the logical value of "1" put in the input terminals A1 and A2 of the logical product computing oscillators OSC1 and OSC2 is larger than the delay time T1 of the delay circuits DE11 and DE12, each of the logical product computing oscillators OSC1 and OSC2 performs a self-retention operation. The delay circuits DE11 and DE12 form independent unit counting circuits together with the logical product computing oscillators OSC1 and OSC2 and rectifying circuits RC1 and RC2, respectively. Even when the first delay circuits DE11 and DE12 are not used, if the feedback circuits F1 and F2 are arranged, a self-retention operation is effected. In this case, however, there is a risk of erroneous self-retention of the logical product computing oscillator OSC1 or OSC2 caused by noise. The delay circuits DE11 and DE12 prevent this erroneous self-retention. Incidentally, the delay circuits DE11 and DE12 may be located in the feedback circuits F1 and F2 respectively.

DE21 and DE22 represent delay circuits putting the outputs of the self-retention circuits into input terminals B2 and B3 of logical product computing oscillators OSC2 and OSC3 of the subsequent stage, respectively, after a certain delay time T2. The delay circuits DE21 and DE22 are inserted into the input terminals A2 and A3 of the logical product computing oscillators OSC2 and OSC3, respectively, so that the counting apparatus does not cause run-away by enumeration pulses which are put therein in parallel. The time from the point of output of the rectifying means RC1 to the point of termination of the delay time T2, that is, the sum (T1+T2) of the delay time T2 and the delay time T1 of the delay circuits DE11 and DE12 in the present embodiment, is made longer than the width T3 of the enumeration input pulse and shorter than the period T4 of the enumeration input pulse, whereby the output value of the second delay circuits DE21 or DE22 is always set between the pulse counted in the precedent stage and the pulse to be counted in the subsequent stage.

Figure 5:
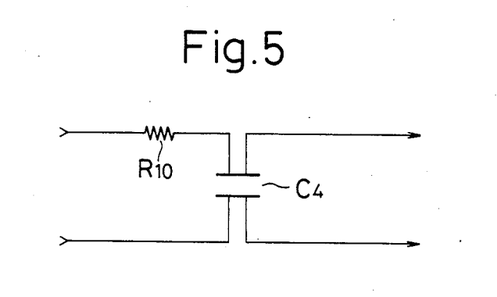
FIG. 5 is a circuit diagram of a delay circuit that can be used in the present invention.

Each of the delay circuits DE11, DE12, DE21 and DE22 is constructed as a delay circuit in which a failure shortening the delay time is not caused. This delay circuit may be constructed by using a four-terminal capacitor, and a specific example is shown in FIG. 5. In the embodiment shown in FIG. 5, since no output is produced in case of either breaking or short circuit in the delay circuit, a failure of a mode shortening the delay time is not caused. In the embodiment, the four-terminal capacitor C4 is combined with a resistor R10. A choke coil may be used instead of the resistor R10. A multi-staged structure may be adopted according to the required delay time.

Figure 6:
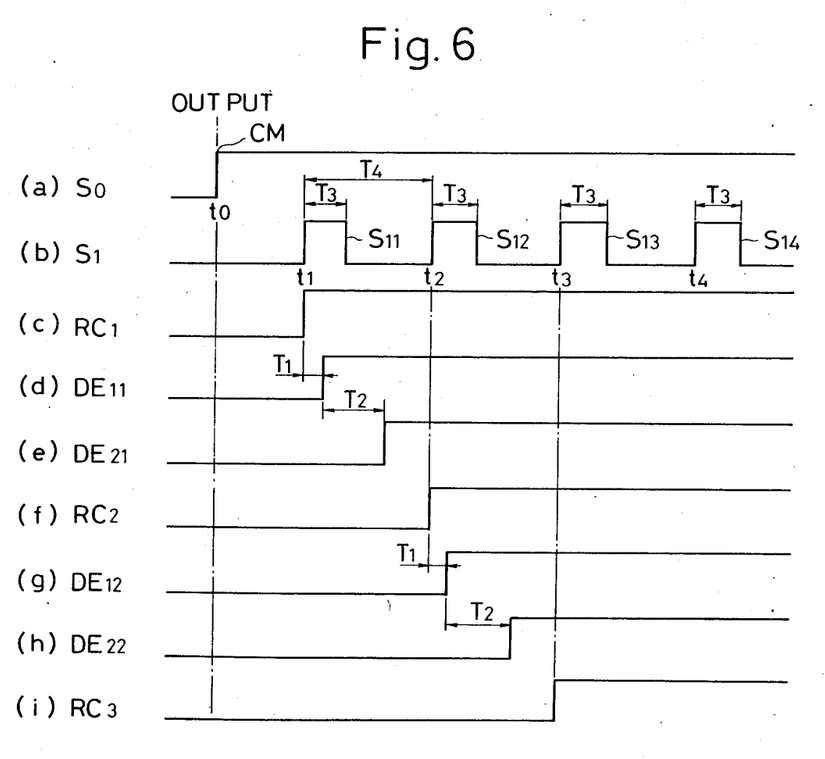
FIG. 6 is a time chart illustrating the operation of the counting apparatus of the present invention.

The operation will now be described with reference to the time chart of FIG. 6. At first, a power source voltage Vb is applied at a time t0 and a counting instruction S0 is given, as shown in (a), and at a time t1, the first pulse S11 of a logical value of "1" having a pulse width T3 is generated by the pulse generator 1, as shown in (b). This pulse P1 is applied in parallel to the input terminals A1 through A3 of the logical product computing oscillators OSC1 through OSC3 and clamped at a level exceeding the limit of the power source voltage Vb by the clamping action of the capacitor C31 and diode D41. Since there is no input at the input terminals B2 and B3 of the logic product computing oscillators OSC2 and OSC3, these oscillators are not actuated. However, the power source voltage Vb is put in the input terminal B1 of the logic product computing oscillator OSC1. Further, oscillating operation is started in this oscillator by the power source voltage Vb and the input S11 exceeding the limit of the power source voltage, which is given to the input terminal A1. Thus, an output as shown in (c) is obtained in the rectifying circuit RC1 connected to the logical product computing oscillator OSC1. After the delay time T1 from the point of appearance of this output, an output as shown in (d) appears from the delay circuit DE11. A part of the output of the delay circuit DE11 is put in the input terminal of the logical product computing oscillator OSC1 through the feedback circuit F1. The delay time T1 is set so that the delay time T1 is shorter than the pulse width T3 of the pulse S11. Thus, the logical product computing oscillator OSC1 performs a self-retention operation.

The output of the first delay circuit DE11 is put in the input terminal B2 of the logical product computing oscillator OSC2 of the unit counting means of the subsequent stage through the second delay circuit DE21. Since the delay circuit DE21 has such a delay time that after the pulse input to the input terminal A2 has disappeared (logical value of "0"), the output (logical value of "1") is put out, even if the output of the delay circuit DE21 of the preceding circuit DE21 is given, an "and" condition that two logical values of "1" should be given is not satisfied, and therefore, the output of the logical product computing oscillator OSC2 is of the same logic as logical value "0" and no oscillating output is produced. Then, when a second pulse S12 (logical value of "1") is generated at a time t2, by the self-retention to the logical product computing oscillator OSC1, the output (logical value of "1") from the delay circuit DE21 is sequentially put in the input terminal B2, and hence two inputs of the logical value of "1" are simultaneously input to the logical product computing oscillator OSC2 and an output as shown in (f) is generated in the rectifying circuit RC2. Namely, the logical product computing oscillator OSC2 counts generation of the second pulse S12. The logical product computing oscillator OSC2 is self-retained by a feedback signal put in the input terminal A2 through the delay circuit DE12 and the feedback circuit F2.

The above operation is repeated by the frequency corresponding to the stage number n of the unit counting means, and an n-th pulse S1n is counted by the logical product computing oscillator of the final stage. Since the stage number is 3 in the present embodiment, the rectifying circuit RC3 of the final stage counts a third pulse S13 as shown in (i).

The fail-safe effect will now be described.

Since the pulse width T3 is not prolonged in the pulse generator 1 at the time of a failure, for example, the output of the delay circuit DE21 or DE22 is not overlapped on the enumeration pulse signal given before. Therefore, erroneous advance of counting is prevented and the time to appearance of the output of the final stage is not shortened and a fail-safe effect is attained.

When a circuit failure occurs in the logical product computing oscillator OSC1, OSC2 or OSC3 or the rectifying circuit RC1 or RC2, no output is generated and generation of an output in the unit counting means of the subsequent stage is impossible, and therefore, the time to appearance of the output of the final stage is prolonged and a fail-safe effect is attained.

When a circuit failure takes place in the delay circuit DE11, DE12, DE21 or DE22, there is no output and a failure mode prolonging the delay time is realized, and a fail-safe effect is attained.

A fail-safe effect is attained in circuits for putting pulses into the logical product computing oscillators OSC1 through OSC3 from the pulse generator 1, as described below.

(a) Failure in Capacitors C31 through C33

Since in case of short circuit of the capacitor C31, C32 or C33 the voltage at the input terminal A1, A2 or A3 cannot be maintained at a level exceeding the limit of the power source voltage, the logical output computing oscillator OSC1, OSC2 or OSC3 is not oscillated. Furthermore, in case of a failure of opening of the capacitor, the pulse from the pulse generator 1 is not put in the logical product computing oscillator OSC1, OSC2 or OSC3, the oscillator is not oscillated.

(b) Failure in Diodes D41 through D43

In case of short circuit of the diode D41, D42 or D43, the pulse input is not input to the input terminal A1, A2 or A3 from the pulse generator. In case of opening of the diode, the loop for discharging charges stored in the capacitor C31, C32 or C33 is extinguished, and input of pulses becomes impossible.

(c) Failure in Diodes D31 through D33

In case of short circuit of the diode, the self-retention is not performed. For example, if short circuit occurs in the diode D31 of the logical product computing oscillator OSC1, when the input pulse disappears, a discharge current flows from the diode D41 to the capacitor C31, and therefore, the voltage of the input terminal A1 is at the level Vs and oscillation is stopped, with the result that the self-retention cannot be attained. Furthermore, at the time of opening, pulses cannot be put in.

Namely, in the above-mentioned embodiment, in case of each of circuit failures such as breaking and short circuit, the output is extinguished or the time for generation of the final output is prolonged. Accordingly, if the apparatus of the present invention is used as timer means for stopping buzzer sounding in a crossing alarm signal apparatus, a fail-safe effect can be attained.

Second Embodiment

Figure 7:
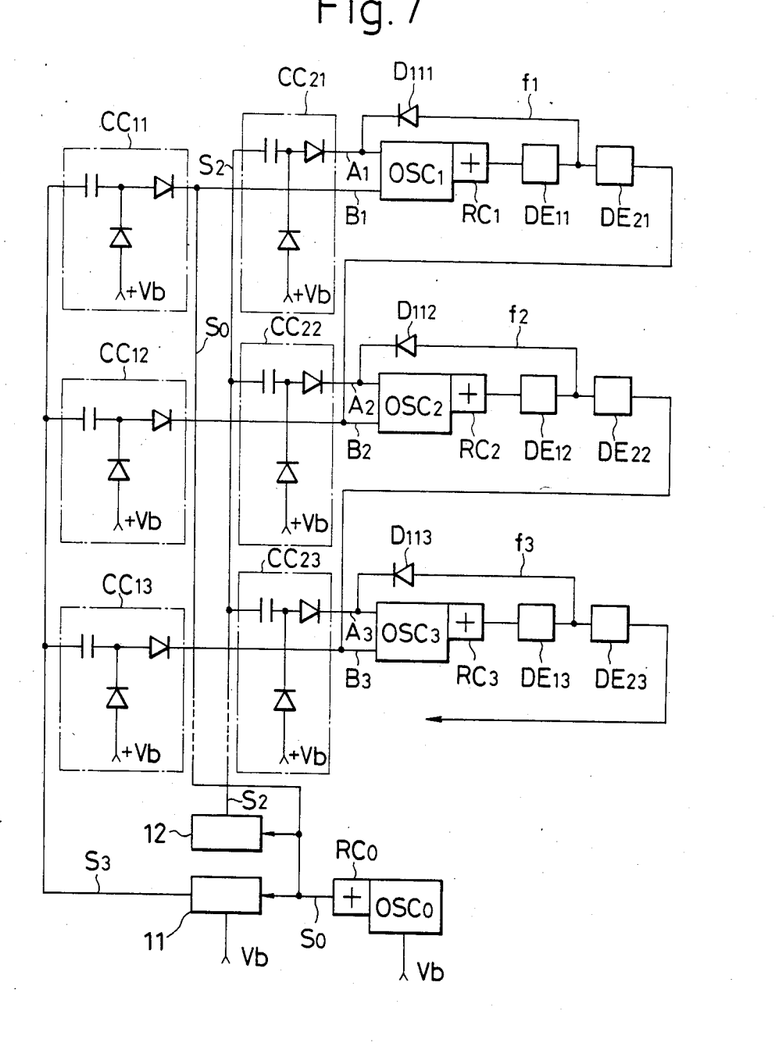
FIG. 7 is a circuit diagram of another embodiment of the counting apparatus of the present invention.

A second embodiment of the counting apparatus of the present invention is illustrated in FIG. 7. For example, this embodiment is suitable as a timer means for starting buzzer sounding after a predetermined time from a point of a counting instruction generated in a crossing alarm signal apparatus, and the alarm object of the input pulse is a pulse of a logical value of "0". Counting is effected when the output from each unit counting means is of a logical value of "0", and an error is made in such a way that counting is advanced, whereby a fail-safe effect is attained.

In FIG. 7, OSC0 represents an oscillator generating a voltage signal S0 acting as a counting instruction, and RC0 represents a rectifying circuit connected to the output side of the oscillator OSC0. These elements are constructed so that at a time of a failure, no output is generated. The rectifying circuit RC0 is the same as the rectifying circuit shown in FIG. 4 in the first embodiment. Furthermore, the logical product computing oscillators OSC1 through OSC3 and rectifying circuits RC1 through RC3 are the same as those in the first embodiment, and the first delay circuits DE11 through DE13 are the same as those in the first embodiment shown in FIG. 5 except the delay circuit structure shown and the delay time T1. Reference numeral 11 represents a pulse generator generating an enumeration input pulse signal S3 (pulse width T3) of a logical value of "0". This enumeration input pulse generator 11 is constructed so that the pulse width T3 is not prolonged at all. If an error is made in such a way that the pulse width T3 is prolonged, the logical product computing oscillators OSC1 through OSC3 described below cannot respond, and there is a risk of an error delaying counting. For example, in case of a crossing alarm signal apparatus, if starting of buzzer sounding is delayed, a very dangerous state is brought about.

Figure 8:
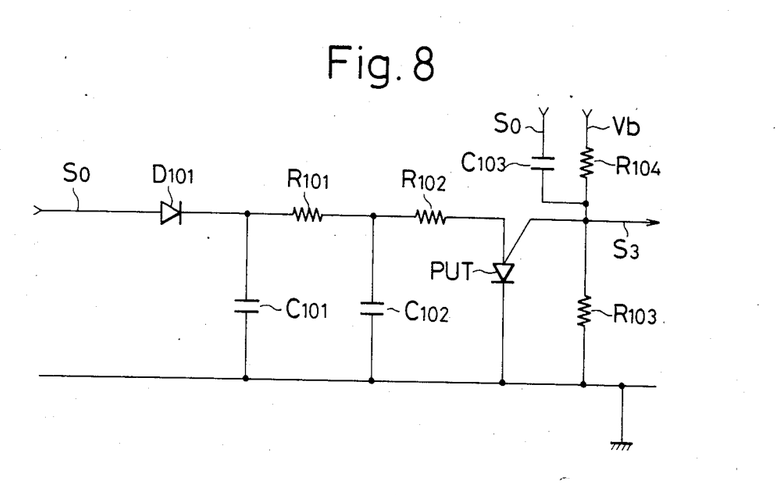
FIG. 8 is a circuit diagram of a pulse generator used in the counting apparatus shown in FIG. 7.

FIG. 8 illustrates a specific example of the pulse generator 11, and an oscillating circuit using a programmable unijunction transistor PUT is shown. R101 and R102 represent resistors, C101 and C102 represent capacitors, and D101 represents a diode. In this pulse generator, the capacitor C101 is charged through the diode D101 by a counting instruction signal S0 put in from the oscillatr OSC0, and the programmable unijunction transistor PUT is oscillated at a period determined by C102 and R102 and an enumeration input pulse signal S3 is put out as the terminal voltage of a resistor R103 connected between a gate and the cathode of the PTU. In the case where n pulses are counted at a period T4 of the enumeration input pulse signal S3, if a condition of C101, R101>nt is satisfied in the time constant restricted by C101 and R101, even after the counting instruction signal S0 has been extinguished, the terminal voltage is left at the capacitor C101 for a time T1 determined by the time constant restricted by C101 and R101, and during this time, PUT continues the oscillating operation.

If the enumeration input pulse signal S3 is generated synchronously with disappearance of the counting instruction signal S0, the counting precision is further improved. This can be accomplished by supplying a differential pulse in the moment when the counting instruction signal S0 passes through the capacitor C103.

In the pulse generator shown in FIG. 8, if a circuit failure takes place thereof, PUT stops the oscillation and the enumeration input pulse signal S3 is extinguished, and the terminal voltage of the resistance as the output voltage of PUT is set at the voltage obtained by dividing the power source voltage Vb by the resistances R104 and R103, or the power source voltage Vb or zero. In short, such a prolongation of the pulse width of the enumeration input pulse signal S3 is not caused. In FIG. 8, the circuit is constructed so that the terminal voltage of the resistance R103 is utilized as the pulse output voltage S3, but an amplifier may be employed in the subsequent stage.

The enumeration input pulse signal S3 is put in parallel into the input terminals B1, B2 and B3 of the logical product computing oscillators OSC1 through OSC3. Clamping circuits CC11 through CC13 comprising a capacitor and two diodes as shown in FIG. 1 are included in the enumeration pulse input circuits of the logical product computing oscillators OSC1 through OSC3, respectively. The counting instruction signal S0 from the logical product computing oscillator OSC0 and the enumeration input pulse signal S3 are supplied in parallel into the input terminal B1.

A set signal S2 obtained by differentiating the counting instruction signal S0 from the oscillator OSC0 through the differential circuit 12 is put in input terminals A1, A2 and A3 of the logical product computing oscillators OSC1, OSC2 and OSC3. Clamping circuits CC21 through CC23 as described above are similarly connected to input circuits for the set signal S2.

The counting instruction oscillating means in the present embodiment comprises the oscillator OSC0, the rectifying circuit RC0 and the differential circuit 12.

Parts of the outputs of first delay circuits DE11 through DE13 are fed back to the input terminals A1 through A3 of the logical product computing oscillators OSC1 through OSC3, respectively, through the feedback circuits F1 through F3 each having a diodes D111 through D113. The pulse width T5 of the set signal S2 is made longer than the delay time T1 of the first delay circuits DE11 through DE13 having a structure of the on-delay type as shown in FIG. 5. Accordingly, each of the logical product computing oscillators OSC1 through OSC3 is self-retained.

The second delay circuits DE21 through DE23 put the output values of the first delay circuits DE11 through DE13 after a predetermined delay time T2 in the input terminals B2 and B3 of the logical product computing oscillators OSC2 and OSC3 of the subsequent stage. The delay circuits DE21 through DE23 are arranged so that even if the enumeration input pulse signal S3 is simultaneously put in the input terminals B2 and B3 of the logical product computing oscillators OSC2 and OSC3 of each unit counting means, advance of counting by stopping the oscillating operation of the logical product computing oscillators OSC2 and OSC3 is not effected unless counting in the unit counting means of the preceding stage is completed. The delay time T2 is set so that the delay time T2 is longer than the pulse width T3 of the enumeration input pulse and shorter than its period T4. Namely, the point of termination of the delay time T2 is set between the pulse counted and the pulse to be counted in the subsequent stage.

Figure 9:
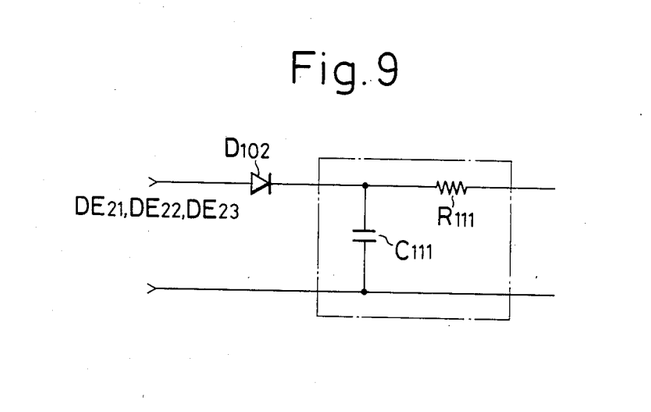
FIG. 9 is a circuit diagram of a second delay circuit used in the counting apparatus shown in FIG. 7.

The second delay circuits DE21 through DE23 are selected so that the delay time T2 is not prolonged by a failure, and each of these delay circuits is of the off-delay type in which delay is not effected at a time of "on". The second delay circuits DE21 through DE23 satisfying these requirements may be constructed, for example, by a diode D102, a capacitor C111 and a resistor R111 arranged on the output side thereof, as shown in FIG. 9. The diode D2 shown in FIG. 4 may be substituted for The diode D102.

Figure 10:
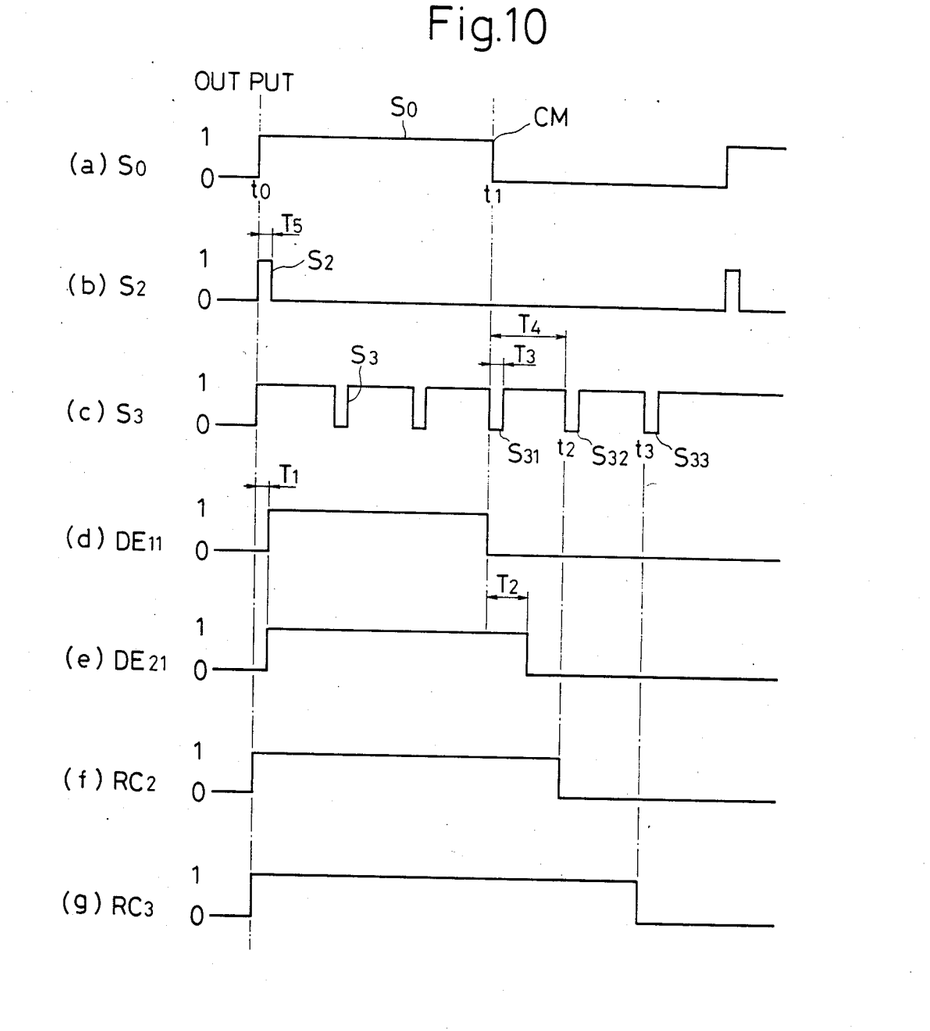
FIG. 10 is a time chart illustrating the operation of the counting apparatus shown in FIG. 7.

The operation will now be described with reference to the time chart of FIG. 10. When the power source voltage is applied to the circuit at a time t0 as shown in (a), a counting instruction signal S0 of a high level (logical value of "1") is put out from the oscillator OSC0 and the rectifying circuit RC0 connected to the output thereof, and this signal is given to the input terminal B1 of the logical product computing oscillator OSC1. Simultaneously, the counting instruction signal S0 is put in the differential circuit 12, and a set signal S2, which is a differential output as shown in (b), is generated. This set signal S2 is put in parallel into the input terminals A1 through A3 of the logical product computing oscillators OSC1 through OSC3.

An enumeration input pulse signal S3 is put under oscillation into the input terminals B1 through B3 simultaneously with the counting instruction signal S0, and the input logics become equal and the logical product computing oscillators OSC1 through OSC3 begin oscillation simultaneously. In order to effect self-retention of this oscillation, it is indispensable that the rectified output of the oscillating output from the first delay circuits DE12 and DE13 should be put at a logical value of "1" into the input terminals A1 through A3 and B1 through B3 within the pulse width T5 of the set signal S2. Since the delay time T1 of the first delay circuits DE11 through DE13 is shorter than the pulse width T5 of the set signal S2, the set signal S2 is self-retained at the input terminals A1 through A3, and the counting instruction signal S0 of a logical value of "1" is put in the input terminal B1 and the oscillation of the logical porduct computing oscillator OSC1 is self-retained as shown in (d). The output of a logical value of "1" from the second delay circuits DE21 and DE22 of the precedent stage is put in the input terminals B2 and B3 before reduction of the level of the enumeration input pulse signal S3 of a logical value of "1", that is, during the time of T4 - T3, with the delay time T1 (T4−T3>T1). Accordingly, the oscillations of the logical product computing oscillators OSC2 and OSC3 are self-retained as is apparent from time charts of (f) and (g). However, it must be noted that the oscillations of the logical product computing oscillators OSC1 thorugh OSC3 are standing by for a counting instruction CM and counting is not advanced for these oscillations.

When the logical value of the counting instruction signal S0 becomes 0 at a time t1 and the counting instruction is given, the oscillation of the logical product computing oscillator OSC1 is stopped in a moment by a first input S31 (logical value of "0" of the enumeration input pulse signal S3, and as shown in (d), the logical value of the output of the first delay circuit DE11 becomes 0 as well as the logical value (0) put in the input terminals A1 and B1 (the output disappears).

Although the enumeration input pulse S31 is simultaneously put also in the input terminal of the logical product computing oscillator OSC2, the output of the logical product computing oscillator OSC1 is given to this input terminal B2 through the delay circuit DE21, and since the delay time T2 of this delay circuit DE21 is shorter than the frequency T4 of the enumeration input pulse signal S3 and longer than the pulse width T3 as shown in (e), the oscillation operation is self-retained and continued in the logical product computing oscillator OSC2 by the signal put in the inlet terminal B2 from the delay circuit DE21. In short, counting is not advanced in the logical product computing oscillators OSC2 and OSC3 by the input pulse signal S31. After the lapse of the delay time T2, the enumeration input pulse signal S3 is restored to the state of a logical value of "1", and therefore, after the lapse of the delay time T2, the oscillating operation of the logical product computing oscillator OSC2 is retained by the enumeration input pulse signal S3.

When a second enumeration input pulse signal S32 is generated at a time t2, the enumeration input pulse signal S32 (logical value of "0") and the output value (logical value of "0") of the second delay circuit DE21 of the preceding stage are put in the input terminal B of the logical product computing oscillator OSC2, and therefore, the oscillation of the logical product computing oscillator OSC2 is stopped (the same logic as that of the logical value of "0") and the pulse signal S32 is counted.

The above operation is repeated by the frequency n corresponding to the stage number of the unit counting means, and the n-th pulse is counted by the logical product computing oscillator of the final stage. Since the stage number is 3 in the present embodiment, the logical product computing oscillator OSC3 of the final stage counts a third enumeration input pulse signal S33 as shown in (g) of FIG. 10.

The fail-safe effect will now be described.

At the time of a failure, a direct current output is produced in the pulse generator 11 and no enumeration input pulse signal S3 is generated, and moreover, the pulse width is not prolonged. Accordingly, after the input S0 is put off, the oscillation of the logical product computing oscillator OSC1 cannot be continued, and also in the subsequent logical product computing oscillators OSC2 and OSC3, it becomes impossible to continue the oscillation. Therefore, a fail-safe effect can be attained. In the case where a failure such as opening or short circuit is caused to occur in the differentiating capacitor C103 inserted for synchronization with disappearance of the counting instruction signal S0, no synchronous pulse is put in and an error is produced in the maximum frequency T4, or the enumeration input pulse signal S3 is earthed and no input pulse signal S3 is supplied. Accordingly, the time to the point of generation of an output in the logical product computing oscillator OSC3 is shortened, and a fail-safe effect is attained.

In the case where a circuit failure occurs in the logical product computing oscillators OSC1 through OSC3 and rectifying circuits RC1 through RC3, no output is generated and since any output is not given to the unit counting means of the subsequent stage, an error is made in such a way that counting is advanced. Accordingly, a fail-safe effect can be attained.

In the case where a circuit failure takes place in the first delay circuits DE11, DE12 and DE13, no output is generated, and in the case where a circuit failure occurs in the second delay circuits DE21, DE22 and DE23, the failure is of such a mode that the delay time is shortened or the output is extinguished. Accordingly, a fail-safe effect is attained.

In connection with the clamping circuits CC11 through CC13 and CC21 through CC23 as the input circuits in the unit counting means, in case of either breaking or short circuit, the oscillation cannot be continued in the logical product computing oscillators OSC1 thorugh OSC3, and an error is made in such a way that counting is advanced. Therefore, a failsafe effect can be attained.

The diodes D111 through D113 shown in FIG. 7 are inserted in the case where the enumeration input pulses put in the input terminals A1 through A3 are absorbed in capacitors constituting the delay circuits DE 11 through DE13 through feedback circuits. In the case where a failure of short circuit takes place in the diodes D111 through D113 shown in FIG. 7, the enumeration input pulses of the input terminals A1 through A3 are absorbed in the capacitors of the first delay circuits DE11 through DE13, and they are not given to the logical product computing oscillators OSC1 through OSC3. In the case where a failure of breaking is caused, all of the logical product computing oscillators OSC1 through OSC3 are not self-retained.

As is apparent from the foregoing description, according to the present embodiment, there is provided a fail-safe counting apparatus in which steering circuits or ternary inputs are not necessary and in connection with the output voltage and counting time, a non-object error characteristic advancing the counting is maintained. Accordingly, this apparatus is practically advantageously used, for example, for preventing delay of starting of buzzer sounding in a crossing alarm signal apparatus.

I claim:

1. An apparatus for counting enumeration input pulses, which comprises counting instruction generation means and a sequence of a plurality of stages of unit counting means, each unit counting means including;

enumeration input pulse generating means for generating an enumeration input pulse having a predetermined pulse width, logical product computing oscillator means receiving an enumeration input pulse and arranged for making an error in such a way that an output is generated when a fault occurs in a circuit, rectifying means for rectifying an output of said logical product computing oscillator means, first delay means arranged subsequently to sid rectifying means, said first delay means arranged for making an error at a time of a fault in such a way that a delay time T1 thereof is not shortened, self-retention means for feeding back an output of said first delay means as an input to the logical product computing oscillator means to effect self-retention of oscillation in said logical product computing oscillator means, and second delay means for putting out the output of said first delay means with a delay time T2, the time from the output of said rectifying means to the point of termination of said delay time T2 being longer than a width T3 of the enumeration input pulse but shorter than a period T4 of the enumeration input pulse, means to determine the delay time T2 and the width of the enumeration input pulse so that an asymmetrical error is generated in such a way that the delay time and pulse width are prolonged or shortened to attain a fail-safe effect, means for inputting a counting instruction from said counting instruction generating means to said logical product computing oscillator means of the unit counting means of said first stage and for inputting the ouput of said second delay means of said unit counting means of a preceding stage to said logical product computing oscillator means of said unit counting means of a subsequent stage, and means for reversing the output of said logical product computing oscillator means of said unit counting means of the first stage to the same logic (oscillation or stopping of oscillation) as that of the first enumeration input pulse and for outputting with the counting instruction as the condition and on condition that the input pulse and the output signal of said second delay means of said unit counting means of the preceding stage are input with the same logical value, the output of said logical product computing oscillator means of said unit counting means of the subsequent stage is reversed to the same logic as the input signal and is put out, and said output of the rectifying means is used as an enumeration value.

2. An apparatus for counting enumeration input pulses according to claim 1, wherein said logical product computing oscillator means have two input terminals A and B and one output terminal C, an enumeration input pulse signal having a pulse of a logical value of "1" as an object to be counted and a feedback signal of said self-retention means are put in said input terminal A, a counting instruction signal of a logical value of "1" is put in the input terminal of said logical product computing oscillator means of the first stage from said counting instruction generating means, output signals of said second delay means of the precedent stages are put in said input terminal B of said logical product computing oscillator means of the subsequent stage, and an oscillation output is put out in said output terminal C under an "and" condition where binary values of a logical value of "1" are put in said input terminals A and B.

3. An apparatus for counting enumeration input pulses according to claim 2, wherein said second delay means makes an error at a time of a fault of any component thereof in such a way that the delay time T2 is not shortened and the enumeration input pulse signal makes an error at a time of a fault in such a way that the pulse width of a logical value of "1" is not prolonged.

4. An apparatus for counting enumeration input pulses according to claim 2, wherein said enumeration input pulse generating means has a double base diode connected between the input terminal and the ground through base resistors, an emitter of said double base diode is connected between a said resistor and a said capacitor of a series circuit having said resistor and said capacitor, which is connected between the input terminal and the ground, and a base voltage of said double base diode on the ground side is put out.

5. An apparatus for counting enumeration input pulses according to claim 2, wherein said first and second delay means are constructed so that the input signal is put in a 4terminal capacitor through a resistor and the output is take out from the capacitor.

6. An apparatus for counting enumeration input pulses according to any of claims 2 through 5, further comprising a buzzer activated in response to a counting instruction and wherein the apparatus for counting is comprised in a timer means for stopping buzzer sounding after a predetermined time from a counting instruction generated in crossing alarm signal apparatus.

7. An apparatus for counting enumeration input pulses according to claim 1, wherein said counting instruction generating means puts out a set signal of said logical product computing oscillator means based on a signal rising from a logical value of "0" and uses a signal rising from a logical value of "1" as a counting instruction signal.

8. An apparatus for counting enumeration input pulses according to claim 1, wherein said logical product computing oscillator means has two input terminals A and B and one output terminal, a set signal of said counting instruction generating means and a feedback signal of said self-retention means are put in said input terminal A, an enumeration input pulse signal having a pulse of a logical value of "0" as an object to be counted and a counting instruction signal from said counting instruction generating means are put in said input terminal B of said logical product computing oscillator means of the first stage, oscillation from said output terminal C is stopped under such a condition that each of the counting instruction signals and enumeration input pulse signals becomes a logical value of "0", the enumeration input pulse signal and output signals of said second delay means of the precedent stage are put in the input terminals of said logical product computing oscillator means of the subsequent stages, and an oscillation output is stopped under such a condition that each of the enumeration input pulse signal and the output signal of said second delay means of the precedent stage becomes a logical value of "0".

9. An apparatus for counting enumeration input pulses according to claim 8, wherein said first delay means has an on-delay structure and the pulse width T5 of the set signal is longer than the delay time T1 of said first delay means.

10. An apparatus for counting enumeration input pulses according to claim 9, wherein said second delay means has an off-delay structure and the delay time T2 of said second delay means is longer than the width T3 of the enumeration input pulse and shorter than the period T4 of the enumeration input pulse.

11. An apparatus for counting enumeration input pulses according to claim 8, wherein said second delay means makes an error at the time of a fault in such a way that the delay time T2 is not prolonged, and the enumeration input pulse signal makes an error at the time of a fault in such a way that the pulse width of a logical value of "0" is not shortened.

12. An apparatus for counting enumeration input pulses according to claim 8, wherein said enumeration pulse generating means has a PUT connected between the input terminal and the ground through a diode and first and second resistors, the portion between said diode and said first resistor is connected to the ground through a first capacitor, the portion between said first and second resistor is connected to the ground through a second capacitor, the gate terminal of said PUT is connected to the dividing point for dividing the power source voltage by third and fourth resistors arranged in series between the power source voltage input terminal and the ground, said division point is used as an output terminal, and said input terminal is connected to said gate terminal through a differential circuit.

13. An apparatus for counting enumeration input pulses according to claim 8, wherein said first delay means has such a structure that the input signal is put in a 4-terminal capacitor through a resistance and an output is taken out from said capacitor.

14. An apparatus for counting enumeration input pulses according to claim 8, wherein said second delay means has such a structure that a resistor is interposed between the input terminal and output terminal and a capacitor is connected between the ground and the portion between said resistor and output terminal.

15. An apparatus for counting enumeration input pulses according to any of claims 8 through 14, further comprising a buzzer and wherein the apparatus for counting is comprised in a timer means for starting sounding of said buzzer a predetermined time after occurrence of a predetermined event in a crossing alarm signal apparatus.

16. An apparatus for counting enumeration input pulses according to claim 2 or 8, wherein said logical product computing oscillator means has such a structure that a standard power source voltage is applied to said input terminal B and when a voltage exceeding the standard power source voltage is applied to said input terminal A, an oscillation output is generated from said output terminal C.

17. An apparatus for counting enumeration input pulses according to claim 2 or 8, wherein said logical product computing oscillator means comprises a first transistor connected between said input terminals A and B through a collector-resistor, a second transistor connected between said input terminals A and B through a collector-resistor, the collector voltage of said first transistor being put in the base of said second transistor, and a third transistor connected between said input terminal A and the power source earth through a collector-resistor and a second zener diode, the collector voltage of said second transistor being put in a base of said third transistor through a first zener diode, and the logical product computing oscillator means has such a structure that the voltage division value by the collector-resistor and said second zener diode is put in the base of said first transistor and said output terminal C is connected between said second zener diode and the collector of said third transistor.

18. In a counting apparatus for counting a number of pulses to generate output signals indicative of occurrence of a predetermined number of pulses, including oscillating means for oscillating at predetermined frequencies to generate pulses to be counted thereby to determine a time period for generating said output signals, the improvement comprising:

a plurality of oscillators arranged in a sequence, feedback means for providing to respective first inputs of said oscillators a form of respective outputs of said oscillators rectified by rectifying means and delayed by first delay periods generated by first delay means, feedforward means for providing to respective second inputs of successive oscillators in said sequence a form of outputs of respective preceding oscillators rectified by said rectifying means and delayed by second delay periods generated by second delay means, and fail-safe means for assuring that the time period for generating said output signals is varied in only one direction upon failure of any of a plurality of circuit components of said oscillators, said rectifying means, said first delay means and said second delay means.

19. An improved counting apparatus as recited in claim 18 further comprising alarm generating means for generating an alarm in response to said output signals, wherein said failsafe means comprises an arrangement of said circuit components of said oscillators, said rectifying means, and said first and second delay means for assuring that said alarm generating means will generate said alarm beginning at a time no later than a predetermined time from occurrence of a count triggering event and for assuring that upon failure of any of said circuit components any change resulting in said beginning time moves said beginning time closer to the time of occurrence of said count triggering event.

20. An improved counting apparatus as recited in claim 18 further comprising alarm generating means for generating an alarm in response to said output signals, wherein said failsafe means comprises an arrangement of said circuit components of said oscillators, said rectifying means, and said first and second delay means for assuring that said alarm generating means will generate said alarm for a time duration no shorter than a predetermined duration and for assuring that upon failure of any of said circuit components any change resulting in said time duration of the generated alarm causes an extension of the time duration of said alarm.

21. An improved counting apparatus as recited in claim 18 wherein said fail-safe means comprises an arrangement of said oscillators in said counting apparatus for assuring an output voltage of said oscillators at a predetermined level in response to failure of any component thereof.

* * * * *